(12) United States Patent
Villette et al.

(10) Patent No.: US 8,858,713 B2
(45) Date of Patent: Oct. 14, 2014

(54) APPARATUS FOR DEPOSITING A THIN FILM OF MATERIAL ON A SUBSTRATE AND REGENERATION PROCESS FOR SUCH AN APPARATUS

(75) Inventors: Jerome Villette, Le Plessis Robinson (FR); Valerick Cassagne, Limours en Hurepoix (FR); Catherine Chaix, Saint-Cloud (FR)

(73) Assignee: Riber, Bezons (FR)

( * ) Notice: Subject to any disclaimer, the term of this patent is extended or adjusted under 35 U.S.C. 154(b) by 326 days.

(21) Appl. No.: 13/379,220

(22) PCT Filed: Jun. 17, 2010

(86) PCT No.: PCT/EP2010/058571
§ 371 (c)(1),
(2), (4) Date: Dec. 19, 2011

(87) PCT Pub. No.: WO2010/146430
PCT Pub. Date: Dec. 23, 2010

(65) Prior Publication Data
US 2012/0097102 A1  Apr. 26, 2012

(30) Foreign Application Priority Data
Jun. 18, 2009  (EP) ..................................... 09305569

(51) Int. Cl.
| C23C 16/455 | (2006.01) |
| C23C 16/44 | (2006.01) |
| C23C 16/00 | (2006.01) |
| B23P 6/00 | (2006.01) |
| C30B 29/40 | (2006.01) |
| C30B 23/00 | (2006.01) |
| C30B 23/02 | (2006.01) |

(52) U.S. Cl.
CPC .............. *C30B 23/02* (2013.01); *C23C 16/455* (2013.01); *C30B 29/403* (2013.01); *C23C 16/45502* (2013.01); *C30B 23/002* (2013.01); *C23C 16/4408* (2013.01); *C23C 16/45544* (2013.01); *C23C 16/4401* (2013.01)
USPC ........... 118/724; 118/722; 118/715; 118/710; 118/708; 29/402.01

(58) Field of Classification Search
None
See application file for complete search history.

(56) References Cited

U.S. PATENT DOCUMENTS

| 5,602,418 A * | 2/1997 | Imai et al. ..................... 257/627 |
| 2002/0005566 A1 | 1/2002 | Weber et al. |
| 2009/0137099 A1 * | 5/2009 | Schonherr et al. ............ 438/478 |

FOREIGN PATENT DOCUMENTS

| EP | 2 060 662 A2 | 5/2009 |
| JP | 61030664 A | 2/1986 |

OTHER PUBLICATIONS

International Search Report, dated Aug. 13, 2010, from corresponding PCT application.

*Primary Examiner* — Dah-Wei D Yuan
*Assistant Examiner* — Jethro Pence
(74) *Attorney, Agent, or Firm* — Young & Thompson

(57) ABSTRACT

Disclosed is an apparatus for depositing a thin film of material on a substrate and a regeneration process. The apparatus includes a chamber, a cryogenic panel disposed inside the chamber, a sample holder able to support a substrate, a gas injector able to inject a gaseous precursor into the chamber, a first trap connected to the vacuum chamber and able to trap a part of the gaseous precursor released by the cryogenic panel, the first trap having a fixed pumping capacity $S_1$. The apparatus for depositing a thin film of material on a substrate includes a second trap having a variable pumping capacity $S_2$ able to be regulated in function of the gaseous precursor partial pressure, the first and second trap providing a total pumping capacity $S=S_1+S_2$ sufficient to maintain the gaseous precursor partial pressure in the vacuum chamber under a determined pressure $P_L$.

20 Claims, 2 Drawing Sheets

APPARATUS FOR DEPOSITING A THIN FILM OF MATERIAL ON A SUBSTRATE AND REGENERATION PROCESS FOR SUCH AN APPARATUS

The present invention relates to an apparatus for depositing a thin film of material on a substrate, and a regeneration process for such an apparatus.

In particular, the present invention relates to apparatus like molecular beam epitaxy system.

Epitaxial gallium nitride (GaN) semiconductor has shown very interesting semi conducting properties for high power and high frequency applications such as high luminescence LED or radiofrequency transistors.

The epitaxy of thin layers of GaN can be done by two main techniques namely, Molecular Beam Epitaxy (MBE) and Metal Organic Chemical Vapor Deposition (MOCVD).

In the case of molecular beam epitaxy technique, an element, Gallium for instance, is evaporated from a melted metal in an effusion cell and the nitrogen element can be supplied by molecular nitrogen cracked by a plasma source or from ammonia in gaseous state from a gas injector which decomposes chemically at the surface of the substrate by thermal activation.

A molecular beam epitaxy device usually comprises a loading compartment wherein a substrate to be coated is introduced, a compartment wherein the substrate is dehydrated, a compartment wherein an operation of deoxidation of the substrate is performed, a growth chamber and trap means pumping the gaseous elements out of the growth chamber. We mean by "trap means", one or more active pumps associated with one or more cryogenic panels.

The substrate, silicon for instance, is introduced in the growth chamber wherein a vacuum of about $10^{-8}$ Pascal is performed. The substrate is heated at a temperature between about 300° C. and 1100° C. Then, gaseous precursor like ammonia is injected in the growth chamber and the atoms or molecules of elements or compounds in the effusion cell is heated to be evaporated. Gaseous ammonia reacts with the evaporated atoms or molecules of elements or compounds at the surface of the substrate to form an epitaxial layer of GaN, for example.

A part of the gaseous precursor which is not cracked during the growth process is trapped on a cryogenic panel covering the inner surface of the lateral wall of the growth chamber and surrounding the process area, for example.

The amount of frozen precursor on the cryogenic panel increases with the number of process runs inducing an extra increase of partial pressure of precursor in the system. Additionally, this precursor ice may clog or disturb system components such as moving parts, robots and gauges.

To avoid these issues, it is then necessary to regenerate the cryogenic panels.

The frozen precursor is re-evaporate by warming up the cryogenic panels. This can be done simply by limiting or switching off the cryogenic source therefore reducing or stopping the circulation of liquid nitrogen in the cryogenic panels.

As the panels warming up to the temperature of the surrounding, precursor sublimates and the gaseous precursor is pumped out of the growth chamber by the trap means.

However, the partial pressure of gaseous precursor increases exponentially with the temperature rise. The gaseous precursor partial pressure is high if the desorbed flow of gaseous precursor is high compared to the pumping capacity of the trap means. If the pumping capacity of the trap means is not efficient, the gaseous precursor partial pressure increases exponentially to a maximum of pressure.

The high pressure of gaseous precursor during the regeneration process may damage heaters of effusion cells and substrate holder and also react with hot source materials like gallium or aluminum used in the semiconductor device structure, and in general all elements that can be sensitive to nitriding.

Cooling down the material sources would prevent thermally activated reaction, but these sources can usually not be switched off during regeneration process for differential thermal expansion reasons like typically for aluminium source, or to prevent a contamination or pollution of a cold source surface, or because they can be the sources of heat to warm-up the system.

In addition, when the partial pressure of gaseous precursor increases exponentially to high pressure, it could be dangerous for the operator manipulating the molecular beam epitaxy system.

One object of the present invention is to provide an apparatus for depositing a thin film of material on a substrate wherein the gaseous precursor partial pressure is controlled during the regeneration of the cryogenic panels of the vacuum chamber.

An other object of the present invention is to provide a regeneration process enabling to evacuate the gaseous precursor initially trapped on the cryogenic panels of the vacuum chamber, out of said vacuum chamber, and in a controlled and automatic manner.

It is possible to not go over a given limit of pressure or determined pressure in order to avoid the saturation of the trap means and to nitride hot components like effusion cell or hot materials, for example. Abrupt increase of gaseous precursor pressure is avoided.

To this end, the invention concerns an apparatus for depositing a thin film of material on a substrate comprising:
  a vacuum chamber,
  a sample holder disposed inside said vacuum chamber, said sample holder being able to support said substrate,
  a gas injector able to inject a gaseous precursor into the vacuum chamber, a part of said gaseous precursor being able to react at the surface of the substrate,
  at least one cryogenic panel positioned inside the vacuum chamber and able to adsorb a part of said gaseous precursor which has not reacted at the surface of the substrate, and to release said adsorbed gaseous precursor,
  first trap means connected to said vacuum chamber and able to trap a part of said gaseous precursor released by said cryogenic panel, said first trap means having a fixed pumping capacity $S_1$.

According to the invention, the apparatus for depositing a thin film of material on a substrate comprises:
  second trap means able to trap an other part of said gaseous precursor released by said cryogenic panel and having a variable pumping capacity $S_2$ able to be regulated in function of the gaseous precursor partial pressure,
  said first and second trap means providing a total pumping capacity $S=S_1+S_2$ sufficient to maintain the gaseous precursor partial pressure in the vacuum chamber under a determined pressure $P_L$.

The invention permits to control the gaseous precursor partial pressure in the vacuum.

According to various embodiments, the present invention also concerns the characteristics below, considered individually or in all their technical possible combinations:
  said second trap means comprise:
    at least a regulating cryogenic element positioned inside said vacuum chamber, said regulating cryogenic element being able to be supplied by a cryogenic fluid, a pressure gauge able to measure the gaseous precursor partial pressure inside the vacuum chamber, generating a measured pressure $P_M$, a valve able to adjust the cryogenic fluid flow into said regulating cryogenic element, and a control unit able to receive said measured pressure $P_M$ and compare this one to the determined pressure $P_L$, if the measured pressure $P_M$ is different from the determined pressure $P_L$, said control unit is able to command said valve for adjusting the cryogenic fluid flow in said regulating cryogenic element, such that the measured pressure $P_M$ reaches the determined pressure $F_L$, said regulating cryogenic element is an additional cryogenic element, said additional cryogenic element is positioned at the lower part of the vacuum chamber.

This position has some interests to trap the ammonia accumulated on the lower part of the cryogenic panel during its regeneration.

said regulating cryogenic element consists in said at least one cryogenic panel positioned inside the vacuum chamber, said sample holder being surrounded by a secondary cryogenic panel, said regulating cryogenic element consists in said secondary cryogenic panel, said first trap means comprise a pumping duct having a wall, said pumping duct being connected to a pumping device by a first ends and emerging into the growth chamber by a second ends, and the wall inner surface of said pumping duct being covered by a cryogenic panel, said first trap means comprise closing means able to isolate the volume of the pumping duct of said first trap means from the volume of the vacuum chamber, the apparatus for depositing a thin film of material on a substrate consists in a molecular beam epitaxy system for producing wafers of semiconductor material comprising a substrate, said vacuum chamber being a growth chamber including further a lateral wall having an inner surface, a cryogenic panel covering the inner surface of said lateral wall, said apparatus for depositing a thin film of material on a substrate comprising at least one effusion cell able to evaporate said atoms or molecules of elements or compounds, a part of said gaseous precursor being able to react with the evaporated atoms or molecules of elements or compounds on the surface of the substrate to form the layer of semiconductor or insulating compound.

The invention also concerns a regeneration process for the cryogenic panels of an apparatus for depositing a thin film of material on a substrate as described above, said regeneration process comprising further the successive steps of:

a) evacuation of the precursor out of the vacuum chamber, said step a) including the operations of:

heating at least a cryogenic panel located inside the vacuum chamber producing the desorption of the gaseous precursor initially adsorbed on said cryogenic panel, trapping at least a part of said desorbed gaseous precursor by first trap means having a fixed pumping capacity $S_1$, a portion of said part of the desorbed gaseous precursor being trapped on the cryogenic panel of said first trap means, b) regeneration of the cryogenic panel of said first trap means, said step b) including the operations of:

isolating said first trap means from the vacuum chamber, heating said cryogenic panel of the first trap means producing the desorption of the trapped gaseous precursor from the cryogenic panel, and pumping said desorbed gaseous precursor by one ore more pumps to reach a high vacuum.

According to the invention, the regeneration process comprises, during the step a):

a complementary trapping operation, by second trap means, of an other part of said gaseous precursor released by said cryogenic panel, said second trap means having a variable pumping capacity $S_2$ able to be regulated in function of the gaseous precursor partial pressure, said trapping operations providing a total pumping capacity $S=S_1+S_2$ sufficient to maintain the gaseous precursor partial pressure in the vacuum chamber under a determined pressure $P_L$.

According to various embodiments, the present invention also concerns the characteristics below, considered individually or in all their technical possible combinations:

the complementary trapping operation comprises the steps of:

measuring the gaseous precursor partial pressure inside said vacuum chamber, generating a measured pressure $P_M$, comparing the measured pressure $P_M$ to the determined pressure $P_L$, if the measured pressure $P_M$ is different from the determined pressure $P_L$, the pumping capacity $S_2$ of a regulating cryogenic element located inside said vacuum chamber is adjusted, such that the measured pressure $P_M$ reaches the determined pressure $F_L$, the pumping capacity $S_2$ of said regulating cryogenic element is adjusted by varying the cryogenic fluid flow in said regulating cryogenic element, the gaseous precursor is gaseous ammonia, the determined pressure $P_L$ being between $10^{-2}$ and $10^{-1}$ Pascal.

The description of the invention is illustrated by the following drawings in which.

Figure 1:
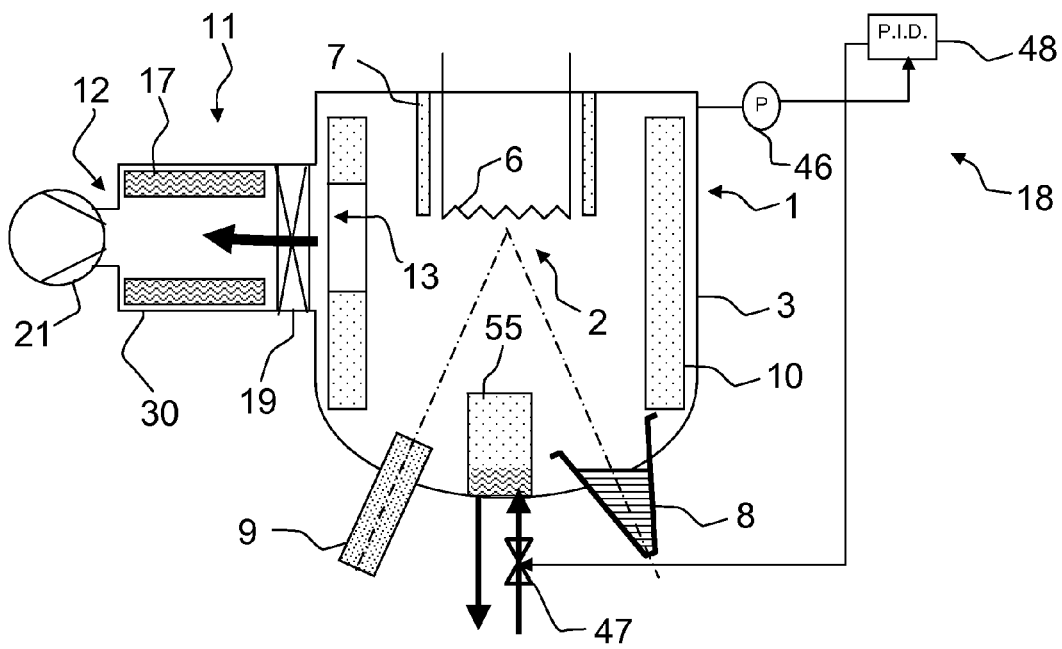
FIG. 1 represents a molecular beam epitaxy system comprising a second trap means according to a first embodiment of the invention.
Figure 2:
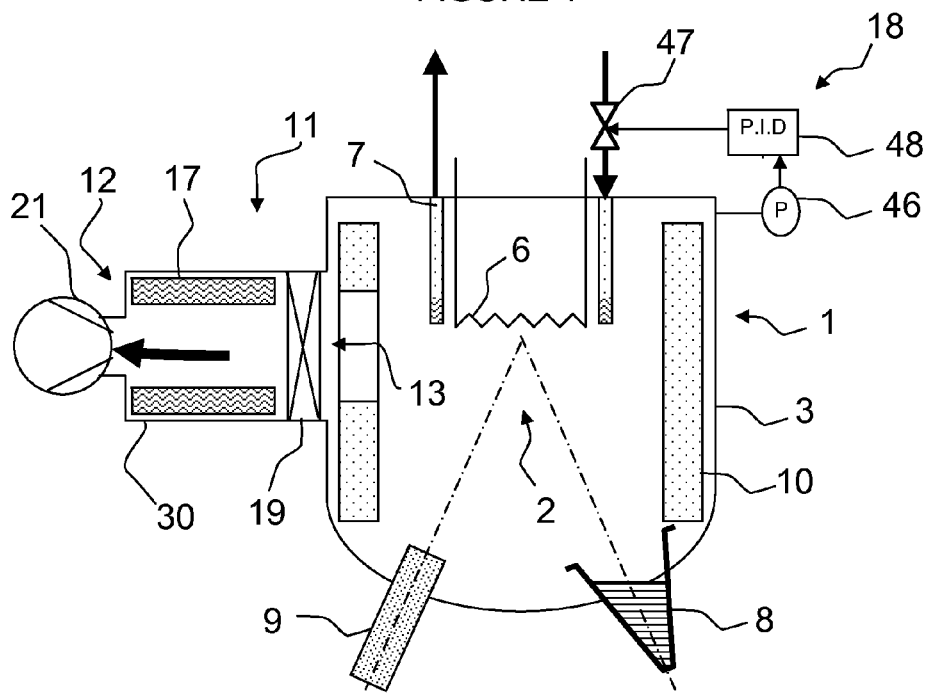
FIG. 2 represents a molecular beam epitaxy system comprising a second trap means according to a second embodiment of the invention.
Figure 4:
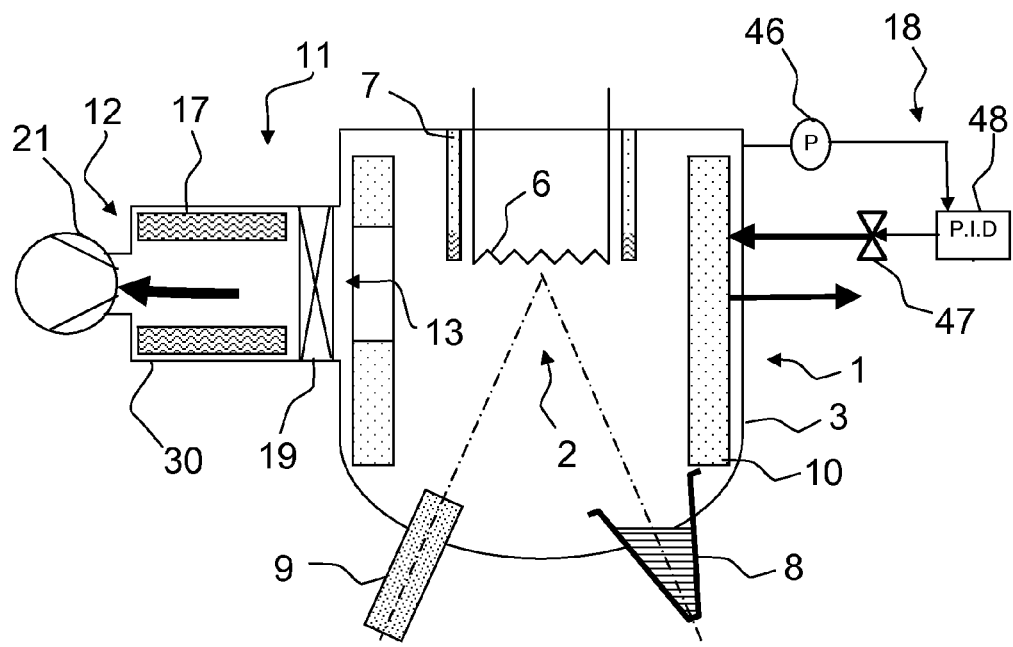
FIG. 4 represents a molecular beam epitaxy system comprising a second trap means according to a third embodiment of the invention.

The FIGS. 1, 2 and 4 represent a molecular beam epitaxy system as an example of apparatus for depositing a thin film of material on a substrate. The invention is not limited to a molecular beam epitaxy system and can be applied to other apparatus for depositing a thin film of material on substrates, like CVD system for instance.

The molecular beam epitaxy system can produce wafers of semiconductor material comprising a substrate covered by a layer of semiconductor or insulating compound.

The molecular beam epitaxy system of FIG. 1 further comprises a growth chamber 1 or vacuum chamber surrounding a process area 2. The growth chamber 1 comprises a lateral wall 3, a lower wall 4 and an upper wall 5. Each of these walls has an inner surface. The growth chamber walls 3, 4, 5 form a unitary assembly which has the general shape of a cylinder.

The molecular beam epitaxy system comprises at least a cryogenic panel 10. In the example of FIG. 1, the molecular beam epitaxy system comprises one cryogenic panel 10 covering the inner surface of the lateral wall 3. We mean by "covering" the fact that the cryogenic panel 10 is disposed along this inner surface of the lateral wall 3 without contacting this last.

This cryogenic panel 10 can be cooled with a cryogenic fluid like liquid nitrogen, glycol or other. Preferably, the cryogenic panel 10 has a cylindrical shape.

The molecular beam epitaxy system comprises a sample holder 6 eventually surrounded by a secondary cryogenic panel 7 which has preferably a cylindrical shape. The sample holder 6 is positioned at the top of the growth chamber 1 and is intended to support a substrate.

The substrate can be silicon, silicon carbide, sapphire, aluminium nitride, diamond, gallium nitride templates, for instance.

The molecular beam epitaxy system comprises at least one effusion cell 8 able to evaporate atoms or molecules of elements or compounds, and a gas injector 9 able to inject a gaseous precursor into the growth chamber 1. The effusion cell 8 and the gas injector 9 are positioned at the bottom of the growth chamber 1.

The atoms or molecules of elements or compounds to be evaporated can be a metal of the group III and the element to be injected can be an element of the group V, for instance.

Preferably, the molecular beam epitaxy system is used to obtain an epitaxial layer of GAN at the surface of a silicon substrate, the element of group III being gallium and the gaseous precursor comprising an element of the group V being ammonia ($NH_3$).

The molecular beam epitaxy system comprises first trap means 11 connected to the growth chamber 1 and able to provide high vacuum capability.

The first trap means 11 can comprise a pumping duct 30 having a wall. The pumping duct 30 is connected to a pumping device 21 by a first end 12 and emerges into the growth chamber 1 by a second end 13.

The cryogenic panel 10 is provided with a hole 22 positioned in front of the second end 13 of the first trap means 11.

The first trap means 11 comprises a cryogenic panel 17 covering the wall inner surface of the pumping duct 30. The cryogenic panel 17 is cooled with a cryogenic fluid like liquid nitrogen or glycol, for example.

We mean by "covering" the fact that the cryogenic panel 17 is disposed along the wall inner surface of the pumping duct 30 without contacting this last.

The pumping device 21 can comprise a high vacuum pump associated with a low vacuum pump (not represented). It comprises switch means enabling to switch between the high vacuum pump and the low vacuum pump.

At high pressure, low vacuum pump which is more efficient, is used. When the pressure is sufficiently low, the high vacuum pump is used. Low vacuum pump can be a root pump and the high vacuum pump can be a turbomolecular pump, for example.

During the growth process, the first trap means 11 is able to pump the gaseous elements which are not pumped by the cryogenic panel 10. The cryogenic panel 10 associated with the first trap means 11 can provide high vacuum capability. The first trap means 11 have a fixed pumping capacity $S_1$ (l/s) and can provide a pumping flow $Q_1$ (Pa·l·s$^{-1}$). $Q_1$ is defined by the relation: $Q_1 = P \times S_1$ with P the gaseous precursor partial pressure (Pascal).

First trap means 11 comprise closing means 19 able to isolate the volume of the pumping duct 30 of the first trap means 11 from the volume of the vacuum chamber 1 during the regeneration process. The pumping duct 30 is like an intermediate volume.

These closing means 19 can consist in a valve disposed between the first trap means 11 and the growth chamber 1.

When too much frozen precursor is accumulated on the cryogenic panels 10 of the growth chamber 1, it is necessary to regenerate these cryogenic panels 10.

The regeneration process of the cryogenic panels 10 comprises a first step a) of evacuation of the precursor out of the vacuum chamber. During this step a), at least a cryogenic panel 10 located inside the vacuum chamber 1 is heated, producing the desorption of the gaseous precursor initially adsorbed on this cryogenic panel 10.

The cryogenic panel 10 is heat-up freely (by stopping the cryogenic fluid flow for example) or with heating source fixed around the wall of the growth chamber 1.

When the flow of cryogenic fluid is stopped in this cryogenic panel 10, the temperature of the cryogenic panel 10 increases and gaseous precursor desorbs from its surface.

Figure 3:
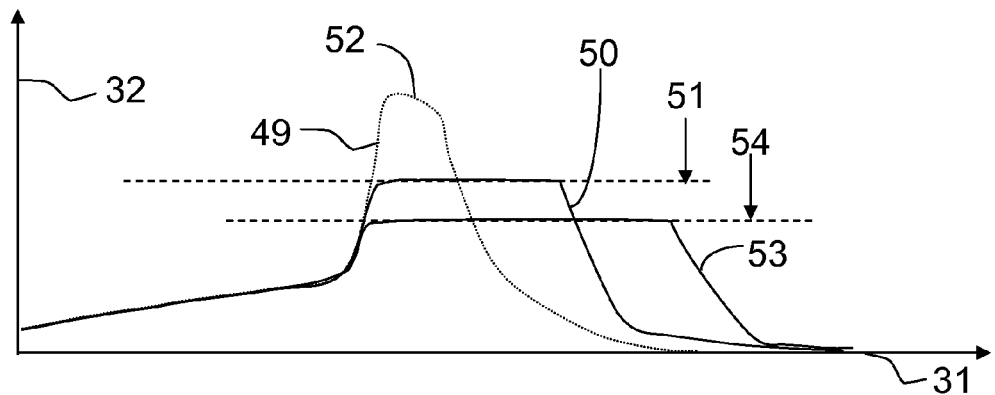
FIG. 3 represents the evolution of gaseous precursor partial pressure in function of time, with and without second trap means.

FIG. 3 represents the evolution of gaseous precursor partial pressure in function of time.

Abscise 31 represents the time and ordinate 32 represents the pressure. The curve referred 49 represents the evolution of the pressure in function of time, for a prior art apparatus.

The curve referred 49 shows that the pressure in the growth chamber 1 increases exponentially to a maximum of pressure 52.

During this step a), a part of the desorbed gaseous precursor is trapped by the first trap means 11. In particular, a portion of this part of the desorbed gaseous precursor is trapped on the cryogenic panel 17 of the first trap means 11. An other portion of this part of the desorbed gaseous precursor is pumped by the pumping device 21.

The principle is to transfer the majority of the gaseous precursor from the cryogenic panels 10 of the growth chamber 1 toward the cryogenic panel 17 of the first trap means 11 which can be isolated later for its regeneration.

In the examples of FIGS. 1 to 3, only the cryogenic panel 10 is regenerated.

The cryogenic panel 17 of the first trap means 11 is cooled, and the closing means 19 are opened in order to permit the transfer of the gaseous precursor desorbing from the cryogenic panel 10 toward the cryogenic panel 17 of the first trap means 11. The pumping device 21 of the first trap means 11 is working during this operation.

The pumping or trapping capacity $S_1$ of the first trap means 11 is the combination of the pumping capacity of the pumping device 21 (actives pumps) and the pumping capacity of the cryogenic panel 17 of the first trap means 11.

The regeneration process can be declined in various procedures.

If the growth chamber 1 comprises several cryogenic panels, the cryogenic panels can be heated simultaneously or sequentially.

For example, during the step a), the cryogenic panels can be heated sequentially.

It permits to separate the different flows of evaporated gaseous precursor from the different cryogenic panels, and so to avoid the addition of pressure due to the addition of these flows.

The regeneration process of the cryogenic panels 10 comprises an operation of regeneration b) of the cryogenic panel 17 of the first trap means 11. During this step b) the first trap means 11 are isolated from the vacuum chamber 1 by the closing means 19.

The cryogenic panel 17 of the first trap means 11 is heated, producing the desorption of the trapped gaseous precursor from the cryogenic panel 17. The desorbed gaseous precursor is pumped by the pumping device 21 to reach a high vacuum.

The pressure of gaseous precursor during the regeneration process of the cryogenic panels 10 depends of three parameters:

- The flow of gaseous precursor which depends of the remaining amount of gaseous precursor, the surface covered by frozen gaseous precursor and the temperature of this surface;
- The pumping capacity S of the pumps used to pump the gaseous precursor. It must be noticed that cryogenic panels which are cooled must be considered as pumps too, as they are collecting gaseous precursor;
- The conductance of the path between the gaseous precursor source (heated cryogenic panels) and the pumps (active pump or cold cryogenic panel).

High gaseous precursor flow, coming from big amount of remaining gaseous precursor, large surface, high temperature, low pumping capacity and low conductance, induces a high pressure.

To reduce this pressure, the regeneration process of the cryogenic panels 10 comprises a complementary trapping operation of an other part of the gaseous precursor released by the cryogenic panels 10.

The molecular beam epitaxy system comprises second trap means 18 having a variable pumping capacity $S_2$ able to be regulated in function of the gaseous precursor partial pressure. The first and second trap means provide a total pumping capacity $S=S_1+S_2$, sufficient to maintain the gaseous precursor partial pressure in the vacuum chamber 1 under a determined pressure $P_L$.

The second trap means 18 permit to maintain the gas pressure in the growth chamber 1 under a desired or determined pressure $P_L$ when the pumping capacity $S_1$ of the first trap means 11 is not sufficient. The aim of the second trap means 18 is to not go over a given limit of pressure in order to avoid to nitride hot components (effusion cell for example) or hot materials. Advantageously, the pressure is linear.

This determined pressure $P_L$ can correspond to a limit wherein the aluminum or gallium source is not oxidized, for example.

For example, when using gaseous ammonia as gaseous precursor, the determined pressure $P_L$ can be between $10^{-2}$ and $10^{-1}$ Pascal.

This determined pressure $P_L$ can correspond to a limit wherein the molecular beam epitaxy system is secured (about $2.10^5$ Pascal).

For a given pumping capacity S, the pressure is proportional to the ammonia flow. Consequently, lowering the regulated pressure induce a lower flow of desorbing ammonia. For a given amount of ammonia, it leads to a longer regeneration time. So the closer the regulated pressure to the determined pressure is, the shorter the regeneration time is.

The second trap means 18 comprise at least a regulating cryogenic element positioned inside the vacuum chamber 1. The regulating cryogenic element is able to be supplied by a cryogenic fluid to be cooled. The cryogenic fluid can be liquid nitrogen or glycol, for example.

In a possible embodiment, represented in FIG. 1, the regulating cryogenic element consists in an additional cryogenic element 55. Preferably, this additional cryogenic element 55 is a small cryogenic panel.

This additional cryogenic element 55 acts as a temporary pump to trap the extra ammonia coming from the big cryogenic panels. Controlling the temperature of a smaller cryogenic panel is easier thanks to its small inertia compared to a large one.

This additional cryogenic element 55 is controlled by a control unit 48, and is preferably positioned at the lower part of the growth chamber 1.

This position has some interests to trap the ammonia accumulated on the lower part of the cryogenic panel 10 during its regeneration.

Alternatively, the additional cryogenic element 55 can be positioned at an other part of the growth chamber 1.

When the regeneration of the cryogenic panel 10 is finished, ammonia is accumulated on the additional cryogenic element 55 and can be evacuate later, for instance.

Cryogenic panels have a huge pumping capacity of ammonia. A surface at liquid nitrogen temperature (78 K) has a pumping capacity of 100 000 l/s per square meter for ammonia, which is huge, compared to the pumping capacity of a turbomolecular pump or cryogenic pump having a pumping speed of 5000 l/s.

Alternatively, the regulating cryogenic element consists in the secondary cryogenic panel 7.

Alternatively, as illustrated in FIG. 4, the regulating cryogenic element can consist in at least one of the cryogenic panels 10 positioned inside the vacuum chamber 1 (lateral or upper or lower cryogenic panel, for instance).

In the FIG. 4, the regulating cryogenic element consists in the cryogenic panel 10 covering the inner surface of the lateral wall 3.

Alternatively, the regulating cryogenic element can consist in a cryogenic panel covering the lateral, the upper and the lower part of the wall of the vacuum chamber 1.

The second trap means 18 comprise a pressure gauge 46 able to measure the gaseous precursor partial pressure inside the vacuum chamber 1, generating a measured pressure $P_M$.

The second trap means 18 comprises a valve 47 able to adjust the cryogenic fluid flow into the regulating cryogenic element. This valve 47 can be an electronic valve.

The control unit 48 of the second trap means 18 receives the measured pressure $P_M$ and compares this one to the determined pressure $P_L$.

If the measured pressure $P_M$ is different from the determined pressure $P_L$, the control unit 48 is able to command the valve 47 for adjusting the cryogenic fluid flow in the regulating cryogenic element, such that the measured pressure $P_M$ reaches the determined pressure $P_L$.

For example, during regeneration of one or more cryogenic panels 10 of the growth chamber 1, if the measured pressure $P_M$ of gaseous ammonia is superior to the determined pressure $P_L$, the valve 47 is opened in order to increase the flow of cryogenic fluid entering in the regulating cryogenic element. Thus the temperature of the regulating cryogenic element decreases. It adsorbs more gaseous ammonia such that the measured pressure $P_M$ decreases to reach the determined pressure $P_L$.

The measured pressure $P_M$ can be around the determined pressure $P_L$ and not exactly equal to this last.

If the measured pressure $P_M$ is inferior to the determined pressure $P_L$, the valve 47 is closed in order to decrease the flow of cryogenic fluid entering in the regulating cryogenic element. Thus the temperature of the regulating cryogenic element increases. It adsorbs less gaseous ammonia such that the measured pressure $P_M$ increases to reach the determined pressure $P_L$.

In an other possible embodiment, the pressure regulation can be done by adjusting the flow of cryogenic fluid in several regulating cryogenic elements.

This control can be done automatically using the control unit 48 which can be closed loop system with a PID regulator or switch on/switch off hysteresis controller. Alternatively, relays switching electrical power can be used.

In FIG. 3, the curves referred 50 and 53 represent the evolution of the pressure in function of time during the regeneration process while the second trap means 18 control the regulating cryogenic element. This curve 50 is given for a first example of determined pressure $P_L$.

This curve 50 shows that the pressure reaches a maximum of pressure 51 which is inferior to the maximum of pressure 52 reached without second trap means 18.

Others determined pressures $P_L$ are possible. Curve 53 is given for a second example of determined pressure $P_L$. This second determined pressure $P_L$ is lower than the first one, leading to a longer regeneration time.

Curve 53 shows that the pressure in the growth chamber 1 reaches a second maximum of pressure 54, lower than the first maximum of pressure 51.

Gaseous precursor desorbing from one or more cryogenic panels 10 is associated to a desorbing gaseous precursor flow $Q_{des}$. The first and second trap means 11, 18 provide a pumping flow $Q_{pump}$, with $Q_{pump}=Q_{pump1}+Q_{pump2}$. $Q_{pump1}$ is associated with the first trap means 11 and $Q_{pump2}$ is associated with the second trap means 18. The invention enables to control the global flow $Q=Q_{des}-Q_{pump}$, with $Q=P\times S$ (P being the pressure and S the pumping capacity).

Thus, the invention enables to limit the pressure of gaseous precursor, ammonia for instance, in a vacuum or growth chamber of an apparatus for depositing a thin film of material on a substrate, during the regeneration of the cryogenic panels of the growth chamber. For instance, components like effusion cell can be kept in a hot status without risk to damage them.

The invention claimed is:

1. An apparatus for depositing a thin film of material on a substrate comprising:
    a vacuum chamber,
    a sample holder disposed inside said vacuum chamber, said sample holder being configured to support said substrate,
    a gas injector configured to inject a gaseous precursor into the vacuum chamber, a part of said gaseous precursor being configured to react at the surface of the substrate,
    at least a first cryogenic panel positioned inside the vacuum chamber, and configured to adsorb a part of said gaseous precursor which has not reacted at the surface of the substrate and to release said adsorbed gaseous precursor,
    a first trap connected to said vacuum chamber and configured to trap a part of said gaseous precursor released by said first cryogenic panel, said first trap having a fixed pumping capacity $S_1$, and a second trap configured to trap an other part of said gaseous precursor released by said first cryogenic panel, during the trapping of the part of said desorbed gaseous precursor by the first trap, said second trap having a variable pumping capacity $S_2$, and configured to be regulated in function of the gaseous precursor partial pressure,
    said first trap and said second trap providing a total pumping capacity $S=S_1+S_2$ sufficient to maintain the gaseous precursor partial pressure in the vacuum chamber under a determined pressure $P_L$.

2. The apparatus according to claim 1, wherein said second trap comprises:
    a regulating cryogenic element positioned inside said vacuum chamber, said regulating cryogenic element configured to be supplied by a cryogenic fluid,
    a pressure gauge configured to measure the gaseous precursor partial pressure inside the vacuum chamber, generating a measured pressure $P_M$,
    a valve configured to adjust the cryogenic fluid flow into said regulating cryogenic element, and
    a control unit configured to receive said measured pressure $P_M$ and compare said pressure $P_M$ to the determined pressure $P_L$,
    wherein when the measured pressure $P_M$ is different from the determined pressure $P_L$, said control unit is configured to command said valve to adjust the cryogenic fluid flow in said regulating cryogenic element, such that the measured pressure $P_M$ reaches the determined pressure $P_L$.

3. The apparatus according to claim 2, wherein said regulating cryogenic element is an additional cryogenic element.

4. The apparatus according to claim 2, wherein said regulating cryogenic element is positioned in said at least one first cryogenic panel positioned inside the vacuum chamber.

5. The apparatus according to claim 2, wherein said sample holder is surrounded by a secondary cryogenic panel, and said regulating cryogenic element is positioned in said secondary cryogenic panel.

6. The apparatus according to claim 1, wherein said first trap comprises a pumping duct having a wall, said pumping duct being connected to a pumping device by a first ends and emerging into the vacuum chamber by a second ends, and the wall inner surface of said pumping duct is covered by a second cryogenic panel.

7. The apparatus according to claim 6, wherein said first trap comprise a closing means configured to isolate the volume of the pumping duct of said first trap from the volume of the vacuum chamber.

8. The apparatus according to claim 1, further comprising a molecular beam epitaxy system for producing wafers of semiconductor material comprising a substrate,
    said vacuum chamber being a growth chamber including further a lateral wall having an inner surface, a cryogenic panel covering the inner surface of said lateral wall,
    said apparatus comprising at least one effusion cell configured to evaporate atoms or molecules of elements or compounds, a part of said gaseous precursor being configured to react with the evaporated atoms or molecules of elements or compounds on the surface of the substrate to form a layer of semiconductor or insulating compound.

9. A process for regenerating cryogenic panels of an apparatus for depositing a thin film of material on a substrate, said apparatus comprising:
    a vacuum chamber;
    a sample holder disposed inside said vacuum chamber, the sample holder being configured to support the substrate;
    a gas injector configured to inject a gaseous precursor into the vacuum chamber, a part of the gaseous precursor being configured to react at the surface of the substrate;
    at least a first cryogenic panel positioned inside the vacuum chamber, and configured to adsorb a part of the gaseous precursor which has not reacted at the surface of the substrate and to release the adsorbed gaseous precursor;

a first trap connected to the vacuum chamber and configured to trap a part of the gaseous precursor released by the first cryogenic panel, the first trap having a fixed pumping capacity $S_1$, and a second trap configured to trap an other part of the gaseous precursor released by the first cryogenic panel, the second trap having a variable pumping capacity $S_2$ and configured to be regulated in function of the gaseous precursor partial pressure;

the first trap and the second trap providing a total pumping capacity $S=S_1+S_2$ sufficient to maintain the gaseous precursor partial pressure in the vacuum chamber under a determined pressure $P_L$;

the process comprising:

a) evacuation of the gaseous precursor out of the vacuum chamber, said evacuation comprising:

heating the at least first cryogenic panel, producing a desorption of the gaseous precursor initially adsorbed on said first cryogenic panel, and trapping a part of said desorbed gaseous precursor by the first trap, a portion of said part of the desorbed gaseous precursor being trapped on a second cryogenic panel of said first trap, and b) regeneration of the second cryogenic panel of said first trap, said regeneration comprising:

isolating said first trap from the vacuum chamber, heating said second cryogenic panel, producing a desorption of the trapped gaseous precursor from the second cryogenic panel, and pumping said desorbed gaseous precursor by one or more pumps to produce a vacuum, the process further comprising, during the trapping of the part of said desorbed gaseous precursor by the first trap in step a), conducting a complementary trapping operation, by the second trap, of an other part of said gaseous precursor released by said first cryogenic panel, said second trap having a variable pumping capacity $S_2$ configured to be regulated in function of the gaseous precursor partial pressure, said trapping operations by the first and second traps providing a total pumping capacity $S=S_1+S_2$ sufficient to maintain the gaseous precursor partial pressure in the vacuum chamber under a determined pressure $P_L$.

10. The process according to claim 9, wherein the complementary trapping operation comprises:

measuring the gaseous precursor pressure inside said vacuum chamber, generating a measured pressure $P_M$, comparing the measured pressure $P_M$ to the determined pressure $P_L$, and if the measured pressure $P_M$ is different from the determined pressure $P_L$, then adjusting the pumping capacity $S_2$ of a regulating cryogenic element located inside said vacuum chamber, such that the measured pressure $P_M$ reaches the determined pressure $P_L$.

11. The process according to claim 10, wherein the pumping capacity $S_2$ of said regulating cryogenic element is adjusted by varying the flow of cryogenic fluid in said regulating cryogenic element.

12. The process according to claim 9, wherein the gaseous precursor is gaseous ammonia, the determined pressure $P_L$ being between $10^{-2}$ and $10^{-1}$ Pascal.

13. The apparatus according to claim 2, wherein said first trap comprises a pumping duct having a wall, said pumping duct being connected to a pumping device by a first ends and emerging into the vacuum chamber by a second ends, the wall inner surface of said pumping duct being covered by a cryogenic panel.

14. The apparatus according to claim 3, wherein said first trap comprises a pumping duct having a wall, said pumping duct being connected to a pumping device by a first ends and emerging into the vacuum chamber by a second ends, the wall inner surface of said pumping duct being covered by a cryogenic panel.

15. The apparatus according to claim 4, wherein said first trap comprises a pumping duct having a wall, said pumping duct being connected to a pumping device by a first ends and emerging into the vacuum chamber by a second ends, the wall inner surface of said pumping duct being covered by a cryogenic panel.

16. The apparatus according to claim 5, wherein said first trap comprises a pumping duct having a wall, said pumping duct being connected to a pumping device by a first ends and emerging into the vacuum chamber by a second ends, the wall inner surface of said pumping duct being covered by a cryogenic panel.

17. The apparatus according to claim 2, further comprising a molecular beam epitaxy system for producing wafers of semiconductor material comprising a substrate, said vacuum chamber being a growth chamber including further a lateral wall having an inner surface, a cryogenic panel covering the inner surface of said lateral wall, said apparatus comprising at least one effusion cell configured to evaporate atoms or molecules of elements or compounds, a part of said gaseous precursor being configured to react with the evaporated atoms or molecules of elements or compounds on the surface of the substrate to form a layer of semiconductor or insulating compound.

18. The apparatus according to claim 3, further comprising a molecular beam epitaxy system for producing wafers of semiconductor material comprising a substrate, said vacuum chamber being a growth chamber including further a lateral wall having an inner surface, a cryogenic panel covering the inner surface of said lateral wall, said apparatus comprising at least one effusion cell configured to evaporate atoms or molecules of elements or compounds, a part of said gaseous precursor being configured to react with the evaporated atoms or molecules of elements or compounds on the surface of the substrate to form a layer of semiconductor or insulating compound.

19. The apparatus according to claim 4, further comprising a molecular beam epitaxy system for producing wafers of semiconductor material comprising a substrate, said vacuum chamber being a growth chamber including further a lateral wall having an inner surface, a cryogenic panel covering the inner surface of said lateral wall, said apparatus comprising at least one effusion cell configured to evaporate atoms or molecules of elements or compounds, a part of said gaseous precursor being configured to react with the evaporated atoms or molecules of elements or compounds on the surface of the substrate to form a layer of semiconductor or insulating compound.

20. The apparatus according to claim 5, further comprising a molecular beam epitaxy system for producing wafers of semiconductor material comprising a substrate, said vacuum chamber being a growth chamber including further a lateral wall having an inner surface, a cryogenic panel covering the inner surface of said lateral wall, said apparatus comprising at least one effusion cell configured to evaporate atoms or molecules of elements or compounds, a part of said gaseous precursor being configured to react with the evaporated atoms or molecules of elements or compounds on the surface of the substrate to form a layer of semiconductor or insulating compound.

\* \* \* \* \*